United States Patent
Bertram et al.

(10) Patent No.: US 9,112,451 B2
(45) Date of Patent: Aug. 18, 2015

(54) ELECTRONIC RADIO SYSTEM FOR POWER AMPLIFICATION WITH PROTECTION IN TERMS OF STANDING WAVE RATE AND ASSOCIATED METHOD OF PROTECTION

(75) Inventors: Pierre Bertram, Cholet (FR); Yannick Menard, Cholet (FR); Christophe Desevedavy, Cholet (FR); Eric Souchard, Cholet (FR)

(73) Assignee: THALES, Neuilly sur Seine (FR)

( * ) Notice: Subject to any disclaimer, the term of this patent is extended or adjusted under 35 U.S.C. 154(b) by 0 days.

(21) Appl. No.: 14/127,352

(22) PCT Filed: Jun. 19, 2012

(86) PCT No.: PCT/EP2012/061684
§ 371 (c)(1),
(2), (4) Date: Dec. 18, 2013

(87) PCT Pub. No.: WO2012/175484
PCT Pub. Date: Dec. 27, 2012

(65) Prior Publication Data
US 2014/0118064 A1    May 1, 2014

(30) Foreign Application Priority Data
Jun. 21, 2011    (FR) ...................................... 11 01911

(51) Int. Cl.
*H03G 3/00*    (2006.01)
*H03F 1/52*    (2006.01)
(Continued)

(52) U.S. Cl.
CPC .. *H03F 1/00* (2013.01); *H03F 1/52* (2013.01); *H03G 3/3042* (2013.01); *H03F 2200/393* (2013.01); *H03F 2200/451* (2013.01); *H03F 2200/462* (2013.01)

(58) Field of Classification Search
USPC ....................................... 330/298, 207 P, 278
IPC ...................................... H03G 3/00; H03F 1/52
See application file for complete search history.

(56) References Cited

U.S. PATENT DOCUMENTS 5,994,965 A * 11/1999 Davis et al. ................... 330/295
7,260,377 B2 * 8/2007 Burns et al. ................... 455/341
(Continued)

FOREIGN PATENT DOCUMENTS

| EP | 1557956 A1 | 7/2005 |
| WO | 2008/109268 A1 | 9/2008 |
| WO | 2010/135711 A1 | 11/2010 |

OTHER PUBLICATIONS

International Search Report, dated Jul. 25, 2012, which issued during the prosecution of International Patent Application No. PCT/EP2012/061684.

*Primary Examiner* — Patricia T Nguyen
(74) *Attorney, Agent, or Firm* — Troutman Sanders LLP

(57) ABSTRACT

An electronic radio system for power amplification of a radiofrequency signal having an electronic circuit having at least one in-service amplifier component, a detector measuring at least one electrical parameter of the in-service amplifier component, having at least the intensity of the electric current supplying the in-service amplifier component, a power attenuator adjusting the output power of the electronic circuit, and a programmable circuit receiving and transmitting commands to control the modules of the radio electronic system. The programmable circuit furthermore includes means for obtaining at least one measurement value relating to the intensity of the electric current supplying said in-service amplifier component of said detector and means for controlling said power attenuator in the case where at least one measurement value obtained exceeds a predetermined threshold value corresponding thereto. The invention also relates to an associated electronic circuit protection method.

7 Claims, 3 Drawing Sheets

(51) Int. Cl.
*H03F 1/00* (2006.01)
*H03G 3/30* (2006.01)

(56) References Cited

U.S. PATENT DOCUMENTS

| | | | |
|---|---|---|---|
| 8,344,806 B1 * | 1/2013 | Franck et al. | 330/285 |
| 2004/0184627 A1 * | 9/2004 | Kost et al. | 381/120 |
| 2005/0057303 A1 * | 3/2005 | Leffel | 330/75 |
| 2005/0156669 A1 | 7/2005 | Ando | |
| 2006/0066396 A1 | 3/2006 | Brandt | |
| 2007/0057720 A1 * | 3/2007 | Hand et al. | 330/10 |
| 2008/0218271 A1 | 9/2008 | Mitzlaff et al. | |
| 2011/0095826 A1 | 4/2011 | Hadjichristos et al. | |

* cited by examiner

ELECTRONIC RADIO SYSTEM FOR POWER AMPLIFICATION WITH PROTECTION IN TERMS OF STANDING WAVE RATE AND ASSOCIATED METHOD OF PROTECTION

CROSS-REFERENCE TO RELATED APPLICATIONS

This application is the National Stage under 37 U.S.C. §371 of International Application No. PCT/EP2012/061684, filed Jun. 19, 2012, which claims priority to French Application No. 1101911, filed Jun. 21, 2011. The International Application published on Dec. 27, 2012 as WO 2012/175484. All of the above applications are incorporated herein by reference in their entireties.

FIELD OF THE INVENTION

The present invention relates to a method for protecting a radio power amplifier and an associated electronic radio system.

The invention is within the field of radiofrequency electronics and radio communications.

BACKGROUND

It is well known in that field to use power amplifiers in various radio circuits or cards so as to amplify the radiofrequency (RF) signals, which are initially signals with a low amplitude and power, before transmitting them to a radio antenna.

Power amplifiers are traditionally subject to several forms of protection, so as to avoid damaging the components, in particular the transistors, in case of operation outside the reliability ranges set out upon design. Thus, traditionally, a power amplifier is protected in terms of temperature and current. These forms of action are achieved using corresponding sensors and act directly on the power supply of the power amplifier to be protected, by cutting or decreasing the power supply voltage.

Furthermore, a high standing wave rate (SWR), which occurs when the charge of the antenna is very different from the nominal output charge of the power amplifier, may cause damage to the transistor(s) of the power amplifier.

This known problem is traditionally resolved by using a directional coupler 12 making it possible to measure the amplitude of the direct or incident voltage $P_i$ and the amplitude of the reflected voltage $P_R$ reflected toward the amplifier, as illustrated in FIG. 1. The outputs of the coupler 12 are transmitted to a processing circuit 14 that applies an attenuation value $V_{ATT}$ to the power supply voltage of the power amplifier 10.

However, the bulk of the couplers is not negligible, and sometimes makes them difficult to integrate into very compact products. In particular, in the field of high-frequency (HF) and very high frequency (VHF) bands, the production of power couplers requires the use of transformers wound on ferrite cores, which are expensive to manufacture.

Furthermore, in particular in the field of mobile telephony, SWR protection solutions implementing a protection circuit dedicated to each transistor of a power amplifier have been developed. This type of solution by specific circuitry also has drawbacks, on the one hand in terms of high design and production costs (which are unacceptable for mid-series), and on the other hand in terms of bulk.

It is desirable to resolve at least one of the drawbacks of the state of the art, by proposing protection for an electronic circuit, in particular for a power amplifier, that is relatively compact and less expensive than the known solutions.

SUMMARY

To that end, according to a first aspect, the invention relates to an electronic radio system for power amplification of a radiofrequency signal, having the following modules:
  electronic circuit having at least one in-service amplifier component,
  a detector able to measure at least one electrical parameter of said in-service amplifier component, having at least the intensity of the electrical current supplying said in-service amplifier component,
  a power attenuator able to adjust the output power of said electronic circuit, and
  a programmable circuit able to receive and transmit commands to control the modules of said radio electronic system.

The radio electronic system for power amplification is characterized in that the programmable circuit further includes means for obtaining, from said detector, at least one measurement value relating to the intensity of the electric current supplying said in-service amplifier component of said detector and means for controlling said power attenuator in the case where at least one obtained measurement value exceeds a predetermined threshold value corresponding thereto.

Advantageously, this electronic radio system incorporates electronic circuit protection while having a minimal bulk inasmuch as the pre-existing modules (or components) are reused, and consequently, it is not necessary to develop and add a specific module or circuit. The cost of this protection system incorporated into the electronic radio system is reduced to the development of specific programming for a programmable circuit, also pre-existing.

The electronic radio system may also have one or more of the features below:
  the programmable circuit is capable of periodically processing, at a given period, at least one measurement value of said detector;
  the programmable circuit is capable of controlling said power attenuator iteratively to attenuate the power by a predetermined value, until at least one measurement value obtained from said detector is below said corresponding predetermined threshold value;
  at least one predetermined threshold value depends on a power mode connected to the power of the radiofrequency signal emitted by said electronic radio system,
  the programmable circuit further includes means for sending a digital alarm signal to a digital control card capable of exchanging control data with the programmable circuit, in the case where at least one obtained measurement value exceeds said predetermined corresponding threshold value;
  the electronic circuit is a power amplifier having at least one in-service transistor.

According to a second aspect, the invention relates to a method for protecting an electronic circuit having at least one in-service amplifier component, implemented in an electronic radio system for power amplification having said electronic circuit having at least one in-service amplifier component, a detection module capable of measuring at least one electric parameter of said in-service amplifier component, having at least the intensity of the electrical power supply current of said in-service amplifier component, a power attenuation module capable of regulating the output power from said electronic circuit, and a programmable circuit capable of receiving and transmitting commands to control the modules of said electronic radio system. The method is characterized in that it is implemented by said programmable circuit and in that it includes the following steps:

obtaining at least one measurement value from said detector relative to the intensity of the electric supply current of said in-service amplifier component, and implementing said power attenuator in the case where at least one obtained measurement value exceeds a corresponding predetermined threshold value.

The method for protecting an electronic circuit may also have one or more of the features below:

the step for implementing said power attenuator includes sending an attenuation command with a predetermined value, and in that said attenuation command is iterated until at least one measurement value obtained from said detector is below said corresponding predetermined threshold value;

for a given electric parameter, said predetermined threshold value is a first predetermined threshold value, and the method includes, when said measurement value obtained from said detector is below said first predetermined threshold value, the following steps:

obtaining a measurement value from said detector and verifying that said obtained measurement value is below a second predetermined threshold value lower than said first predetermined threshold value, and, in case of positive verification, sending a nominal programming command to said power attenuator.

BRIEF DESCRIPTION OF THE DRAWINGS

Other features and advantages of the invention will emerge from the description thereof provided below, for information and non-limitingly, in reference to the appended figures, in which.

DETAILED DESCRIPTION

The invention will be described in the context of SWR protection of a power amplifier having an in-service transistor, integrated into a radio card, that receives control data from a digital control card.

Figure 1:
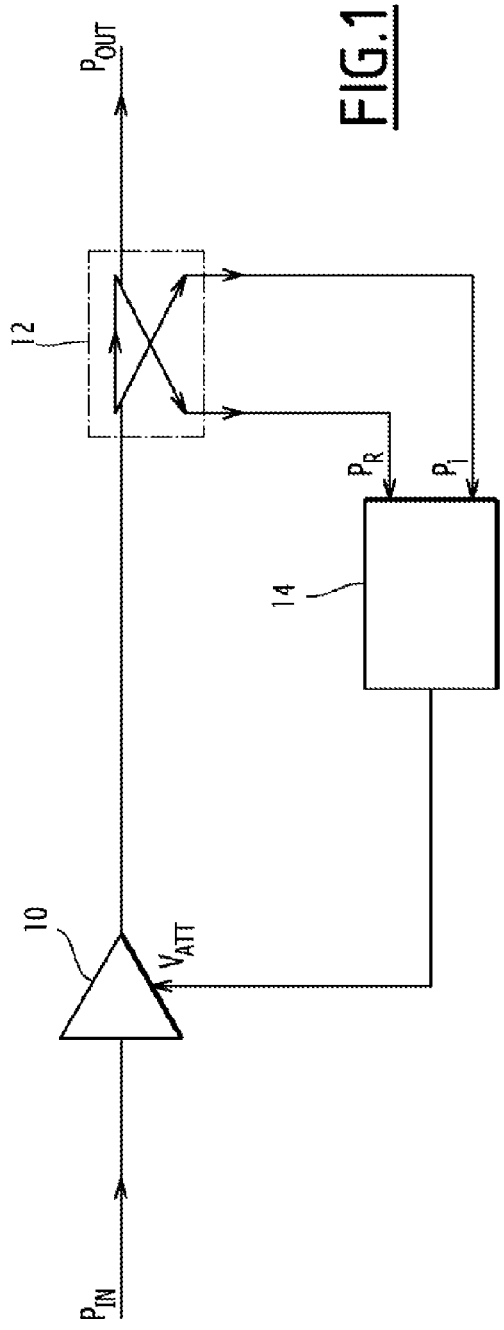
FIG. 1, already described, is a traditional diagram of a power amplifier protection device with a coupler.
Figure 2:
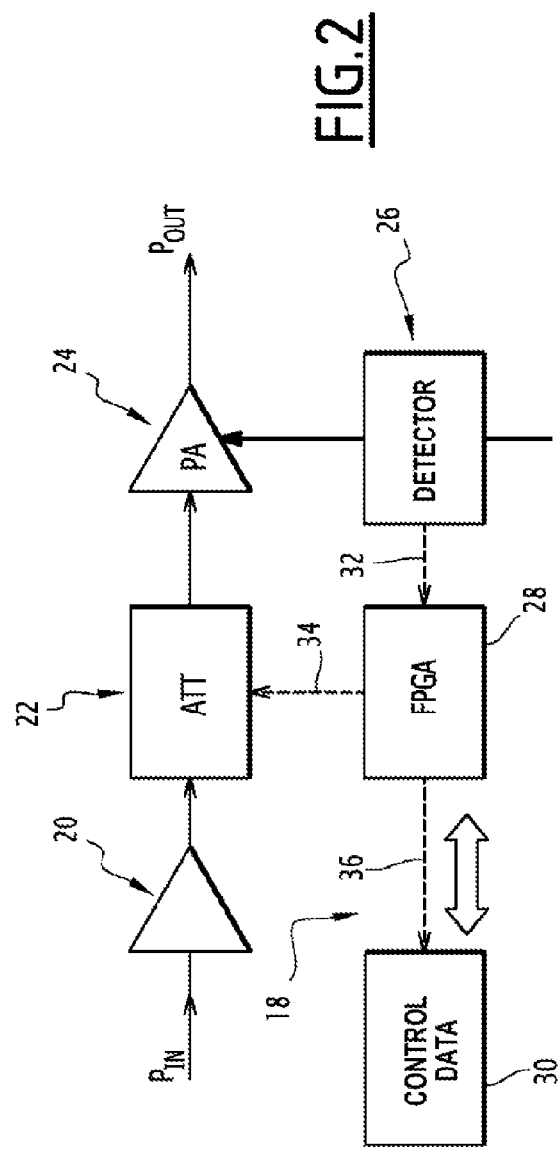
FIG. 2 is a diagram representative of an electronic radio system for power amplification according to the invention.

The power amplifier illustrated in FIG. 2 includes a radio card 18, having an input for a power RF signal $P_{IN}$ to be amplified, which arrives as the input of a first amplifier 20.

The output of this first amplifier is connected to a power attenuator 22, which is for example an ALC (Automatic Level Control) digital attenuator that makes it possible to adjust the output power $P_{OUT}$ of a power amplifier 24. In one example, the power attenuator 22 is an MMIC (Microwave Monolithic Integrated Circuit), which has a minimal bulk.

The power amplifier 24 is an electronic circuit having one or more transistors. Preferably, the transistors are LDMOS (Laterally Diffused Metal Oxide Semiconductor), which have a good robustness at high voltages, which advantageously makes it possible not to require a specific voltage protection circuit.

In one particular example, the amplifier 24 includes multiple transistors, only one of which is in service or active during a given period.

It should be noted that the diagram of FIG. 2 is simplified. In particular, several cascading amplifiers may be provided between the attenuator 22 and the power amplifier 24.

The system of FIG. 2 includes a current detector 26, allowing monitoring of the power supply current of the in-service transistor of the power amplifier 24. The detector 26 is capable of measuring the instantaneous value of the direct current I_PA by providing a voltage Vout proportional to the measured current. In a traditional radio card, such a current detector is present to allow the complete cutoff of the power supply in the event a predetermined value is exceeded. In the radio card according to the invention, the instantaneous value of the direct current I_PA provided by the detector 26 is used to control the power attenuator 22, as explained in detail below.

In one example, the detector 26 includes an analog sensor measuring the power supply current followed by an analog-digital converter.

In an alternative example, the detector 26 is able to measure, in addition to the current intensity, other electric parameters, such as the voltage, of the in-service transistor of the power amplifier 24. The other electric parameters are used similarly to the current intensity, with corresponding predetermined threshold values, as explained below.

The system of FIG. 2 also includes an FPGA (Field Programmable Gate Array) programmable circuit 28 that is capable of receiving and transmitting commands in the form of digital data. Such an FPGA component is present on the radio card to receive control data 30 from a digital control card (not shown in the figure) outside the radio card, for example manually adjustable by a user via a suitable interface of the digital control card. These control data 30, for example relative to the power emitted by the power amplifier or the frequency, are used to control the different components or modules of the radio card.

Additionally, the same FPGA programmable circuit 28 is capable of receiving digital data 32 from the current detector 26 and transmitting digital commands 34 to the power attenuator 22.

The FPGA 28 is advantageously programmed using a specific algorithm that will be described below in reference to FIG. 3, making it possible to periodically monitor the current intensity in the in-service transistor of the power amplifier 24, and, in the event a predetermined upper threshold value is exceeded, to control the attenuator 22 via a command 34, iteratively to gradually decrease the power until the consumed current once again returns below the upper threshold value, while awaiting a return to a normal operating mode. The return to the normal operating mode is determined by the fact that the current intensity in the in-service transistor goes below a lower threshold value that is lower than said upper threshold value.

Thus, advantageously, the protection is only activated if the value measured by the detector 26 exceeds a threshold considered to be dangerous, while preserving maximum operability of the power amplifier.

The FPGA 28 is also programmed to send a digital alarm signal 36 to an external device, for example to the digital control card, such that corrective measures can be taken, for example rearming the system or an alarm intended for the user.

Figure 3:
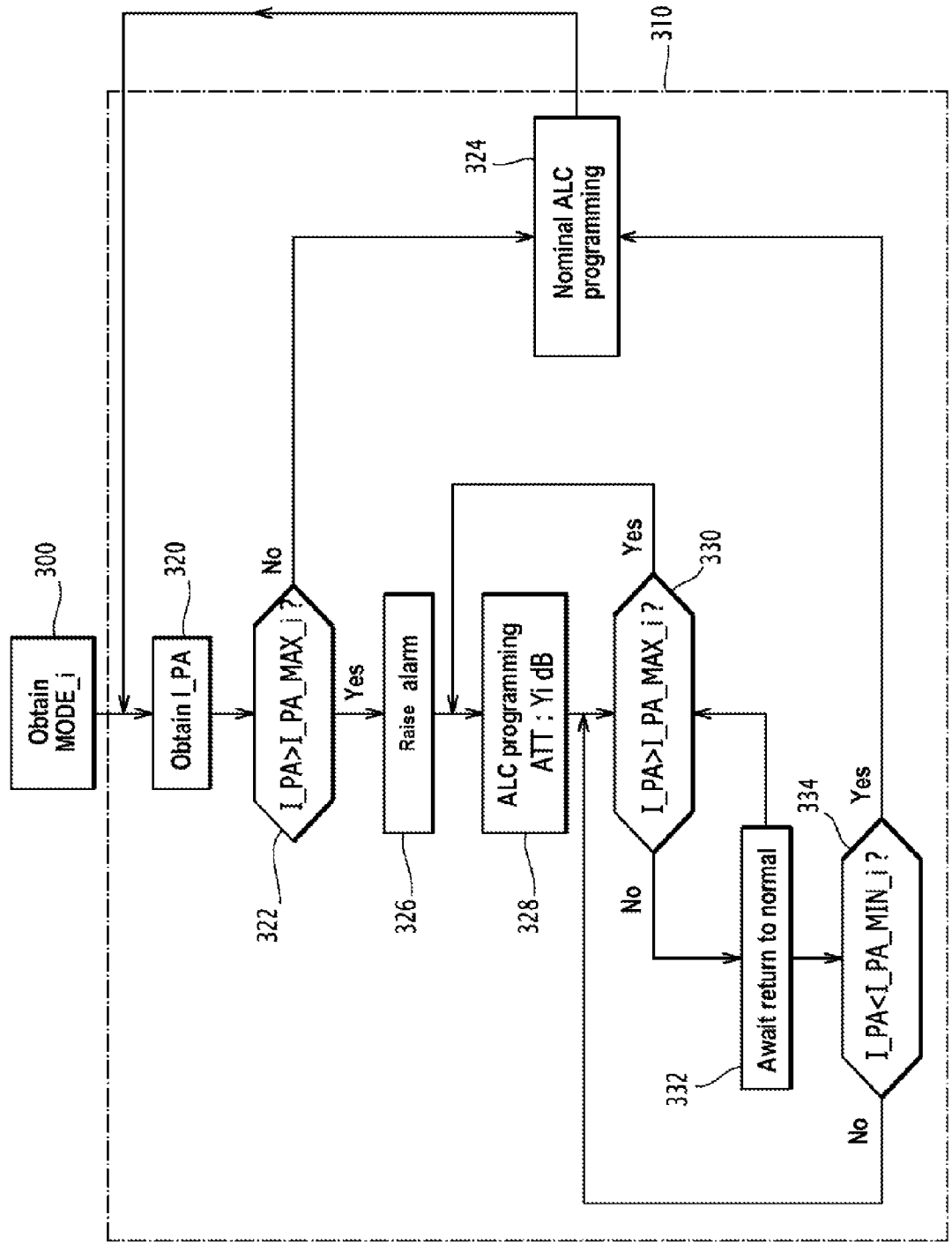
FIG. 3 is a flowchart of a protection method for a power amplifier according to the invention.

FIG. 3 shows a flowchart of a protection method for a power amplifier according to the invention, implemented by the programmable circuit 28.

The programmable circuit then receives, in a step 300, information from the digital control card relative to a current operating power mode, MODE_i, from among multiple possible modes, MODE_0 to MODE_N, defined relative to the power emitted by the power amplifier 24.

Each of these modes corresponds to a predefined operating power range, and has specific characteristics. For each mode, an upper threshold value (I_PA_MAX_i) and a lower threshold value (I_PA_MIN_i) of the current intensity are predefined and stored. For example, these threshold values are stored in a registry or LUT (Look-Up Table) of the FPGA.

In one example, a same lower current intensity threshold value (I_PA_MIN) is considered to be shared by certain power modes.

Next, every X time units, the value X for example being set between 10 microseconds (μs) and 10 milliseconds (ms) depending on the required reactivity of the system, the step 310 for SWR protection for the current power mode MODE_i is implanted. Alternatively, the period X is even shorter, between 1 μs and 3 μs, the protection thus being applied practically continuously.

In one example, this step is carried out after it has been verified that there is no external control command of the frequency attenuator 22 received by the FPGA 28 via the digital control card. Thus, the external commands are applied as a priority, and step 310 does not interfere with a command order given from the outside and received by the FPGA 28.

The SWR protection first includes a step 320 for obtaining an instantaneous measurement value of the current intensity I_PA given by the detector 26. In practice, the FPGA 28 reads the output of the analog digital converter of the detector 26 every X time units.

Next, the measurement value obtained is compared, in step 322, to the upper threshold value I_PA_MAX_i previously stored.

If the measured value I_PA is below the upper threshold value I_PA_MAX_i (negative response to the test in step 322), that means that the in-service transistor of the power amplifier is not in critical operation, and a nominal programming command of the attenuator is sent to the power attenuator 22 in step 324.

Step 324 is followed by a return to step 320.

In the event the upper threshold value I_PA_MAX_i is exceeded (positive response to the test in step 322), a digital alarm signal 36 is raised by the FPGA 28 to the digital control card in step 326.

This step is followed by an attenuation command by a value of Yi dB (decibels) sent to the power attenuator 22 in step 328.

Alternatively, the alarm raising step 326 is applied after or simultaneously with the attenuation command step 328.

In the preferred example, the attenuation or attenuation pitch value Yi is a fixed predetermined value of Y dB of attenuation for all of the operating power modes. For example, it has been observed experimentally that an attenuation pitch Y=3 dB is adequate.

Next, it is again verified in step 330 whether the value I_PA, once again read from the detector 26, exceeds the upper threshold value I_PA_MAX_i. In case of excess (yes response to the test 330), the attenuation command step 328 is iterated.

Advantageously, owing to the iteration of the power attenuation by a pitch of Y dB, the power decrease occurs gradually, allowing the power amplifier 24 always to provide power without a sharp decrease, thereby favoring the operability of the electronic radio system as much as possible for power amplification with SWR protection according to the invention.

Alternatively, the attenuation value Y is modified upward or downward within a range of 10% to 50% upon each iteration, so as to apply a nonlinear power attenuation law.

In case of negative response to the test 330, therefore if the measured value of the intensity drops below the upper threshold value I_PA_MAX_i, a step for waiting to return to a normal state 332 is applied. In practice, the step 332 consists of periodically obtaining, every X time units, the instantaneous measurement of the current intensity I_PA, verifying that it remains below the upper threshold value I_PA_MAX_i, and waiting for a successive drop in the instantaneous measurement values of the current intensity I_PA that are obtained from the detector 26.

The step 332 is followed by a step 334 in which it is verified whether the instantaneous measurement value of the current intensity I_PA, once again obtained from the detector 26, is below a lower threshold value I_PA_MIN_i.

In case of a positive response to the test 334, a nominal programming command is sent to the power attenuator 22 in step 324, already described.

According to one alternative not shown in the figure, a time delay of a predetermined length, for example a length included between 2× and 5× time units, is applied, and it is next verified (step 334) that the instantaneous measurement value of the current intensity is still below the lower threshold value, so as to ensure that it involves a return to a normal operating situation, therefore that the cause for the critical operation has been eliminated by a corrective measure.

In case of negative response to the test 334, therefore if the measured value of the current intensity I_PA is greater than the lower threshold value I_PA_MIN_i, the step 334 is followed by the step 330 previously described.

Figure 4:
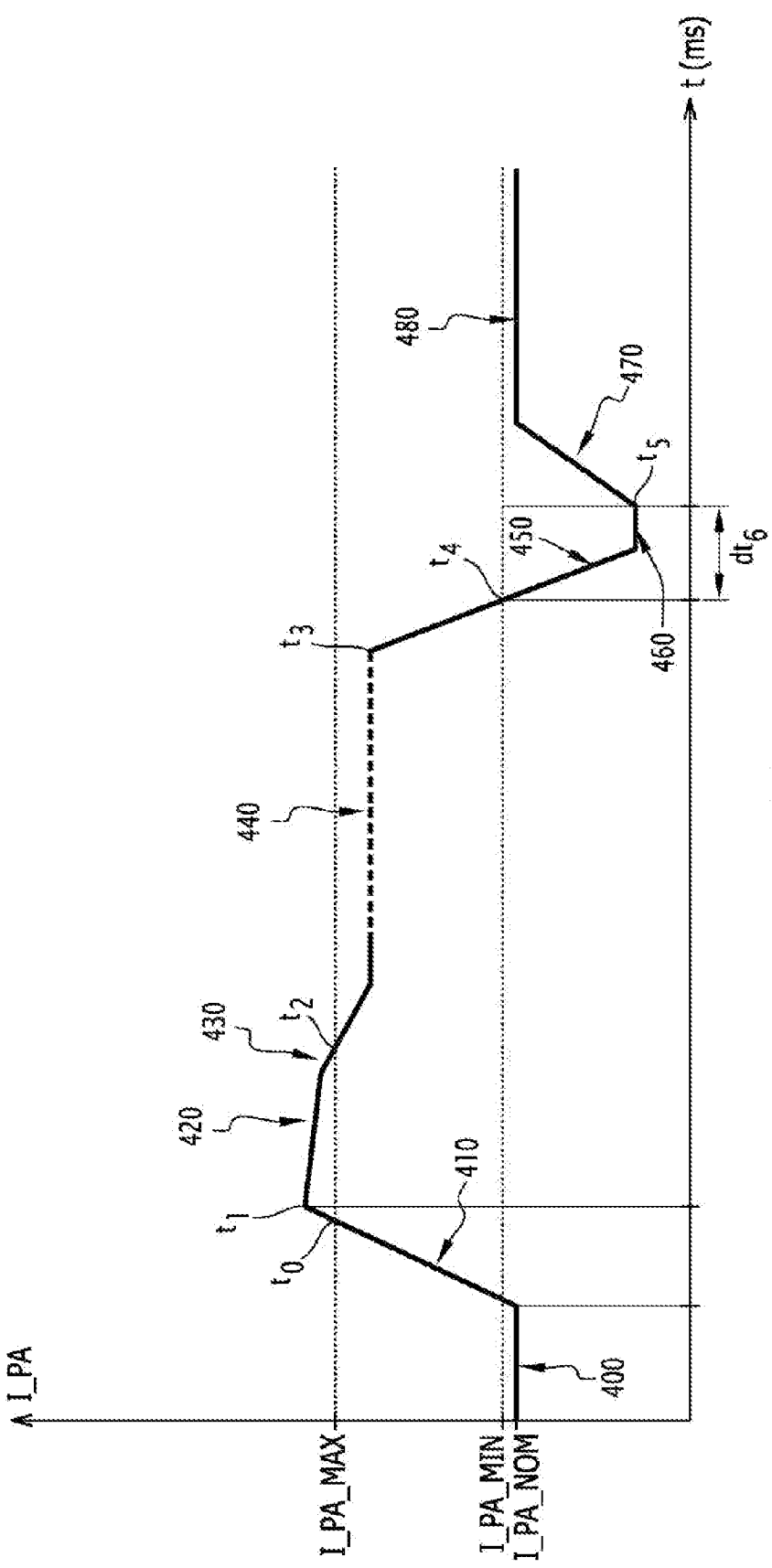
FIG. 4 is a current evolution curve of an in-service transistor during implementation of the method according to the invention.

FIG. 4 diagrammatically shows a curve of the current evolution of an in-service transistor during implementation of the method according to the invention.

In FIG. 4, the evolution of the intensity of the measured current I_PA in amperes (A) is shown as a function of time, for a given power mode.

In dotted lines, two straight lines are drawn respectively corresponding to the upper threshold value I_PA_MAX equal to 1.2 A and the lower threshold value I_PA_MIN equal to 0.9 A.

For a first period 400, the current I_PA is constant and equal to an initial value I_PA NOM very slightly below I_PA_MIN in this example. Very generally, the nominal current intensity in the normal operating mode is very close to the lower threshold value I_PA_MIN.

Next, an operating anomaly, typically a sharp increase in the SWR, for example due to the sudden disconnection of the antenna, causes the power supply current of the in-service transistor to increase during the period 410. At moment t0, the current intensity I_PA exceeds the upper threshold value I_PA_MAX.

This excess is observed at moment t1, which is a moment activating monitoring of the power supply current by the FPGA.

During the periods 420 and 430, the monitoring and iterative attenuation algorithm for the power described in reference to FIG. 3 is applied, in particular in steps 322 to 328.

At moment t2, the current intensity I_PA drops below the upper threshold value I_PA_MAX.

During the period 440, the current intensity I_PA is stabilized below the upper threshold value I_PA_MAX.

The stabilization period 440 is followed by a period for decreasing the intensity of the current I_PA during the period 450, from the moment t3, which corresponds to a corrective action, for example the reconnection of the antenna by a user. At the moment t4, the current intensity I_PA drops below the lower threshold value I_PA_MIN.

Next, during a short period 460, the current intensity stabilizes at a low value, following the combined effect of the corrective action and the power attenuation previously applied.

Next, the current intensity is below the lower threshold value I_PA_MIN for a duration dt6=t5-t4 ms. The duration dt6 is typically greater than the application period of the SWR protection. In one example, the duration dt6 is approximately from 100 μs to 10 ms.

The step 334 for verifying the value of the current intensity relative to the lower threshold value I_PA_MIN of the algorithm described in reference to FIG. 3 is applied during that period 460.

Next, the step 324 for commanding nominal programming of the attenuator 22 is sent, which allows the intensity of the current to increase from moment t5, during a period 470, to next reach the nominal rating 480, at the same current intensity value as during the initial period 400.

The invention claimed is:

1. An electronic radio system for power amplification of a radiofrequency signal, comprising the following modules:
   an electronic circuit comprising at least one in-service amplifier component,
   a detector able to measure at least one electrical parameter of said in-service amplifier component, comprising at least the intensity of the electrical current supplying said in-service amplifier component,
   a power attenuator able to adjust the output power of said electronic circuit, and
   a programmable circuit able to receive and transmit commands to control the modules of said radio electronic system,
   wherein the programmable circuit further includes a unit obtaining, from said detector, at least one measurement value relating to the intensity of the electric current supplying said in-service amplifier component of said detector, and
   a unit controlling said power attenuator in the case where at least one obtained measurement value exceeds a predetermined threshold value corresponding thereto, said control unit being able to control said power attenuator iteratively to attenuate the power by a predetermined value by repeatedly attenuating the power by the predetermined value, until at least one measurement value obtained from said detector is below said corresponding predetermined threshold value, so as to gradually decrease the power.

2. The system according to claim 1, wherein the programmable circuit is capable of periodically processing, at a given period, at least one measurement value of said detector.

3. The system according to claim 1, wherein at least one predetermined threshold value depends on a power mode connected to the power of the radiofrequency signal emitted by said electronic radio system.

4. The system according to claim 1, wherein the programmable circuit further includes a unit sending a digital alarm signal to a digital control card capable of exchanging control data with the programmable circuit, in the case where at least one obtained measurement value exceeds said predetermined corresponding threshold value.

5. The system according to claim 1, wherein the electronic circuit is a power amplifier comprising at least one in-service transistor.

6. A method for protecting an electronic circuit comprising at least one in-service amplifier component, implemented in an electronic radio system for power amplification comprising said electronic circuit comprising at least one in-service amplifier component, a detection module capable of measuring at least one electric parameter of said in-service amplifier component, comprising at least the intensity of the electrical supply current of said in-service amplifier component, a power attenuation module capable of regulating the output power from said electronic circuit, and a programmable circuit capable of receiving and transmitting commands to control the modules of said electronic radio system,
   wherein the method is implemented by said programmable circuit and includes the following steps:
   obtaining at least one measurement value from said detector relative to the intensity of the electric supply current of said in-service amplifier component, and
   implementing said power attenuator in the case where at least one obtained measurement value exceeds a corresponding predetermined threshold value comprising sending an attenuation command with a predetermined value, and in that said attenuation command is iterated, by repeatedly attenuating the power by the predetermined value, until at least one measurement value obtained from said detector is below said corresponding predetermined threshold value, so as to gradually decrease the power.

7. The method for protecting an electronic circuit according to claim 6, wherein, for a given electric parameter, said predetermined threshold value is a first predetermined threshold value, the method comprising, when said measurement value obtained from said detector is below said first predetermined threshold value, the following steps:
   obtaining a measurement value from said detector and verifying that said obtained measurement value is below a second predetermined threshold value lower than said first predetermined threshold value,
   and, in case of positive verification,
   sending a nominal programming command to said power attenuator.

* * * * *